(12) United States Patent
J et al.

(10) Patent No.: US 10,514,720 B1
(45) Date of Patent: Dec. 24, 2019

(54) HITLESS SWITCHING WHEN GENERATING AN OUTPUT CLOCK DERIVED FROM MULTIPLE REDUNDANT INPUT CLOCKS

(71) Applicant: Aura Semiconductor Pvt. Ltd, Bangalore (IN)

(72) Inventors: Raja Prabhu J, Bangalore (IN); Ankit Seedher, Bangalore (IN); Augusto Marques, Bangalore (IN); Srinath Sridharan, Bangalore (IN); Kulbhushan Thakur, Bangalore (IN)

(73) Assignee: Aura Semiconductor Pvt. Ltd, Bangalore (IN)

( * ) Notice: Subject to any disclaimer, the term of this patent is extended or adjusted under 35 U.S.C. 154(b) by 0 days.

(21) Appl. No.: 16/419,014

(22) Filed: May 22, 2019

(30) Foreign Application Priority Data

Jun. 19, 2018 (IN) .............................. 201841022836

(51) Int. Cl.
*G06F 1/12* (2006.01)
*H03L 7/197* (2006.01)
*H03L 7/099* (2006.01)
*H03L 7/087* (2006.01)

(52) U.S. Cl.
CPC ................ *G06F 1/12* (2013.01); *H03L 7/087* (2013.01); *H03L 7/0992* (2013.01); *H03L 7/1976* (2013.01)

(58) Field of Classification Search
CPC . G06F 1/12; H03L 7/087; H03L 7/099; H03L 7/0991; H03L 7/0992; H03L 7/197; H03L 7/1972; H03L 7/1974; H03L 7/1976
USPC ....... 327/147, 149, 150, 156, 158, 159, 292, 327/298
See application file for complete search history.

(56) References Cited

U.S. PATENT DOCUMENTS

| | | |
|---|---|---|
| 5,638,410 A | 6/1997 | Kuddes |
| 5,648,964 A | 7/1997 | Inagaki et al. |
| 5,740,211 A | 4/1998 | Bedrosian |
| 6,044,123 A * | 3/2000 | Takla .................. H03L 7/10 327/148 |
| 6,144,674 A | 11/2000 | Peres et al. |
| 6,366,146 B2 | 4/2002 | Fredriksson |

(Continued)

OTHER PUBLICATIONS

Si5345/44/42 Rev D Data Sheet, http://www.mouser.com/ds/2/368/Si5345-44-42-D-DataSheet-968622.pdf, downloaded circa Sep. 12, 2017, 61 pages.

(Continued)

*Primary Examiner* — William Hernandez
(74) *Attorney, Agent, or Firm* — Iphorizons PLLC; Narendra Reddy Thappeta (57) ABSTRACT

A phase locked loop (PLL) includes a multiplexer (MUX), a phase detector, a filter block, an oscillator, a frequency divider, and a clock switch controller, and achieves hitless switching between a primary clock and a redundant clock. The clock switch controller, upon detecting a condition requiring switching from the primary clock to the redundant clock, is operable to restart the feedback divider synchronously with respect to the redundant clock, and derive the output of the PLL from the redundant clock. The PLL further includes a delay block to process delayed phase error signals generated by the phase detector. The PLL performs hitless clock switching in the event of input clock loss or in response to a command to switch input clocks. The PLL further includes circuitry for estimating and cancelling residual phase errors.

20 Claims, 7 Drawing Sheets

(56) References Cited

U.S. PATENT DOCUMENTS

| | | | |
|---|---|---|---|
| 6,570,454 | B2 | 5/2003 | Skierszkan |
| 6,741,109 | B1 | 5/2004 | Huang et al. |
| 6,806,751 | B2 | 10/2004 | Helfinstine |
| 7,405,628 | B2 | 7/2008 | Hulfachor et al. |
| 7,893,736 | B2 | 2/2011 | Palmer et al. |
| 7,965,115 | B2 | 6/2011 | Jin |
| 9,007,105 | B2 | 4/2015 | Jenkins |
| 2007/0285177 | A1 | 12/2007 | Werker |
| 2008/0063131 | A1* | 3/2008 | Furuta .................. H03L 7/10 375/376 |

OTHER PUBLICATIONS

82P33731 Datasheet, https://www.idt.com/document/dst/82p33731-datasheet, downloaded circa Sep. 13, 2017, 65 pages.

AD9547 Data Sheet, Dual/Quad Input Network Clock Generator/Synchronizer, http://www.analog.com/media/en/technical-documentation/data-sheets/AD9547.pdf, downloaded circa Sep. 19, 2017, 61 pages.

Snaa208 Using the LMK0480x/LMK04906 for Hitless Switching and Holdover, http://www.ti.com/lit/an/snaa208/snaa208.pdf, date Jul. 12, 2013, 13 pages.

CS8525 LC/P Line Card Protection Switch for SONET/SDH Systems, http://www.semtech.com/images/datasheet/acs8525.pdf, downloaded circa Sep. 8, 2017, 65 pages.

Slobodan Milijevic, The basics of synchronized Ethernet, Data Transmission, date Apr. 21, 2009, 04 pages.

D.C. Wei, et al., A monolithic low-bandwidth jitter-cleaning PLL with hitless switching for SONET/SDH clock generation, 2006 IEEE International Solid State Circuits Conference—Digest of Technical Papers, Date of Conference: Feb. 6-9, 2006, 2 pages.

* cited by examiner

HITLESS SWITCHING WHEN GENERATING AN OUTPUT CLOCK DERIVED FROM MULTIPLE REDUNDANT INPUT CLOCKS

PRIORITY CLAIM

The instant patent application is related to and claims priority from the co-pending India patent application entitled, "HITLESS SWITCHING WHEN GENERATING AN OUTPUT CLOCK DERIVED FROM MULTIPLE REDUNDANT INPUT CLOCKS", Serial No.: 201841022836, Filed: 19 Jun. 2018, which is incorporated in its entirety herewith to the extent not inconsistent with the disclosure herein.

BACKGROUND

Technical Field

Embodiments of the present disclosure relate generally to clock generators, and more specifically to hitless switching when generating an output clock derived from multiple redundant input clocks.

Related Art

There are several environments in which an output clock is required to be derived from multiple redundant input clocks. Examples of such environments include telecommunication networks, for example, synchronous optical networks (SONET) and synchronous digital hierarchy (SDH).

In such environments, typically, a system/device receives the multiple redundant input clocks, selects one of the multiple input clocks, and generates the output clock locked in phase and frequency to the selected input clock. The frequency of the output clock can be greater or less than (although usually greater than) that of the selected input clock. The term 'redundant' implies that only one valid/functioning input clock is used to derive the output clock at any given time, the other input clocks being redundant during that time.

Switching refers to an operation in which the system/device selects another input clock (other than the currently used one), and generates the output clock from the newly selected input clock. Such switching may be required, for example, when the earlier selected input clock fails, becomes invalid or non-functional, or when a user/operator expressly indicates to the system/device that a different input clock is to be used for deriving the output clock.

When the system/device switches from using one input clock to another input clock, there is often an interval in which the output clock drifts in frequency and/or phase (and thereby exhibits a transient) before locking to the another input clock. A long duration of such interval may not be desirable. Some reasons for such undesirable transients are non-zero phase difference between the pair of input clocks, the non-zero time taken for the system/device to detect a failure of the currently used input clock, etc.

Hitless switching refers to a capability of the system/device to switch between the corresponding input clocks with minimal undesirable effects on the output clock, for example, minimal and as short a transient (or no transient at all) in the output clock as possible.

Several aspects of the present disclosure are directed to hitless switching when generating an output clock derived from multiple redundant input clocks.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A phase locked loop (PLL) includes a multiplexer (MUX), a phase detector, a filter block, an oscillator, a frequency divider, and a clock switch controller, and achieves hitless switching between a primary clock and a redundant clock. The clock switch controller, upon detecting a condition requiring switching from the primary clock to the redundant clock, is operable to restart the feedback divider synchronously with respect to the redundant clock, and derive the output of the PLL from the redundant clock. The PLL further includes a delay block to enable the PLL to lock to, and track, delayed versions of the primary and redundant clocks.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Component

Figure 1:
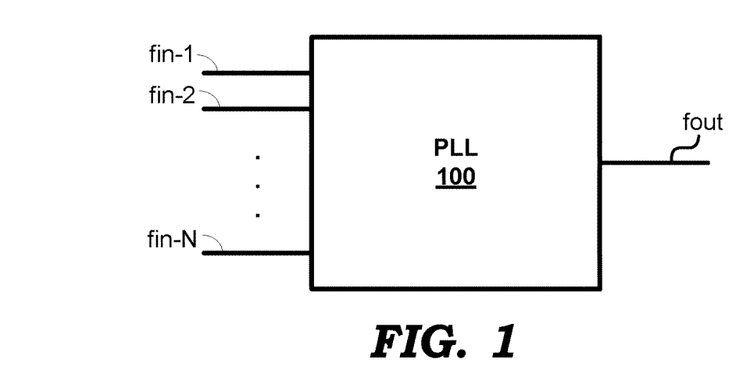
FIG. 1 is a block diagram of an example component in which several aspects of the present disclosure can be implemented.

FIG. 1 is a block diagram of an example component in which several aspects of the present disclosure can be implemented. FIG. 1 shows phase locked loop (PLL) 100 connected to receive input clocks fin-1, fin-2 through fin-N. PLL 100 is operable to select any of the input clocks, and to generate an output clock fout that is based on (or derived from) the selected input clock. Typically, the input clocks and fout have square-wave waveforms, and the frequency of fout is a multiple of the frequency of the currently selected input clock. One of the clocks (e.g., fin-1) is typically used as a primary clock, and the other (N−1) of the input clocks may be redundant clocks. Accordingly, PLL 100 generates fout from the primary clock until the selected primary clock either fails (no or invalid signal) or until a user indicates (via corresponding means not shown) which of the other input clocks is to be used to generate fout.

Several environments, such as telecommunication networks, require such an input clock selection and output clock (fout) generation scheme. Thus, the frequencies of clocks fin-1 through fin-N may all be the same predetermined frequency (or can be all brought to the same frequency within bounded error limits), while the respective phases of fin-1 through fin-N may be different. Examples of such networks/environments include synchronous optical networks (SONET) and synchronous digital hierarchy (SDH), well known in the relevant arts, and as also noted above.

One drawback in prior systems that provide such an output clock generation scheme based on a selected one of multiple input clocks occurs when the system switches from one input clock to another. Typically, a PLL in the prior system is in a locked state with respect to one input clock. If the selected input clock were to fail, detection of such failure takes a finite amount of time, and during the process of detection, the output clock can drift in frequency (equivalent to transient noise in the output clock), which may not be desired. Further, after selection of another (new) input clock, the output clock may take a further non-zero amount of time to lock to the new input clock, since the phases of the old and new clocks are not guaranteed to be the same. In other instances, the user may indicate that another (new) input clock be selected to derive the output clock even when there is no failure of the old input clock. Again, due to the phases of the two input clocks potentially not being aligned, the output clock may exhibit drift/noise until the PLL has locked to the new input clock.

Figure 2:
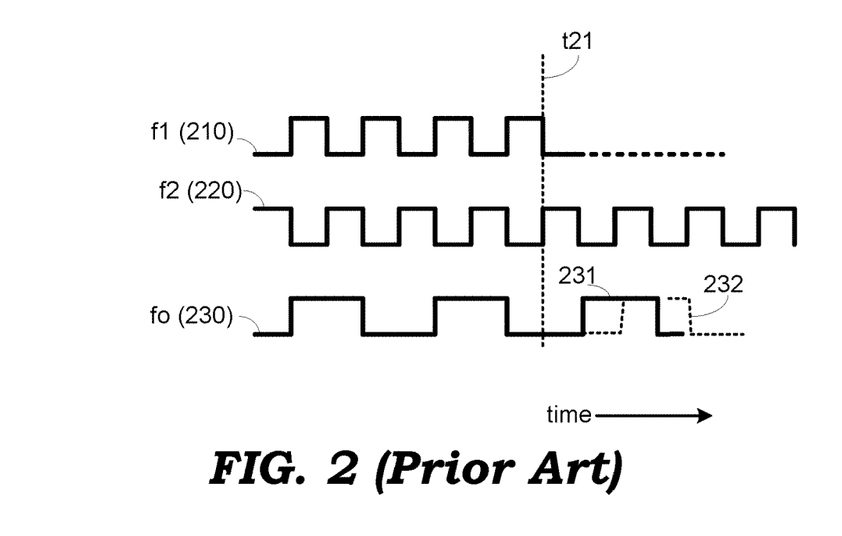
FIG. 2 is a timing diagram illustrating the effects of phase error between a pair of input clocks on an output clock when switching from one input clock to the other.

FIG. 2 illustrates the above noted drift/noise drawback in a prior system. For conciseness and ease of description, only two input clocks f1 (210) and f2 (220) are assumed to be present. Further, output clock f0 (230) is shown as having a frequency that is a fraction of the frequencies of f1 and f2 to simplify the illustration there, although PLLs typically generate an output clock having a frequency greater than, or a multiple of that of the input clock(s). The output clock is f0 (230), and is assumed for the purpose of illustration to be half the frequency of either of f1 and f2 (although typically multiples rather than fractions are used). The system is locked to f1 until t21, at which time instant f1 fails (or the system is otherwise required to use f2 as the input clock starting at t21). Starting at t21, the system is required to generate f0 from f2. However, due to the phase difference (180 degrees in the example) between f1 and f2, for a finite amount of time immediately following t21, f0 drifts in frequency and/or phase as indicated by the dotted portion 232. Marker 231 represents the corresponding portion of f0 as it would have been had the switch over from f1 to f2 not taken place. It is noted here that the portion 232 is shown merely to highlight the problem that would occur, and the exact change in frequency and/or phase of f0 starting at t21 may depend on the state of PLL 100 at t21, and in general on the characteristics (including bandwidth) of PLL 100.

PLL 100 implemented according to aspects of the present disclosure minimizes or avoids such drawbacks as noted above and provides hitless switching, and is described in detail next.

3. Phase Locked Loop

Figure 3:
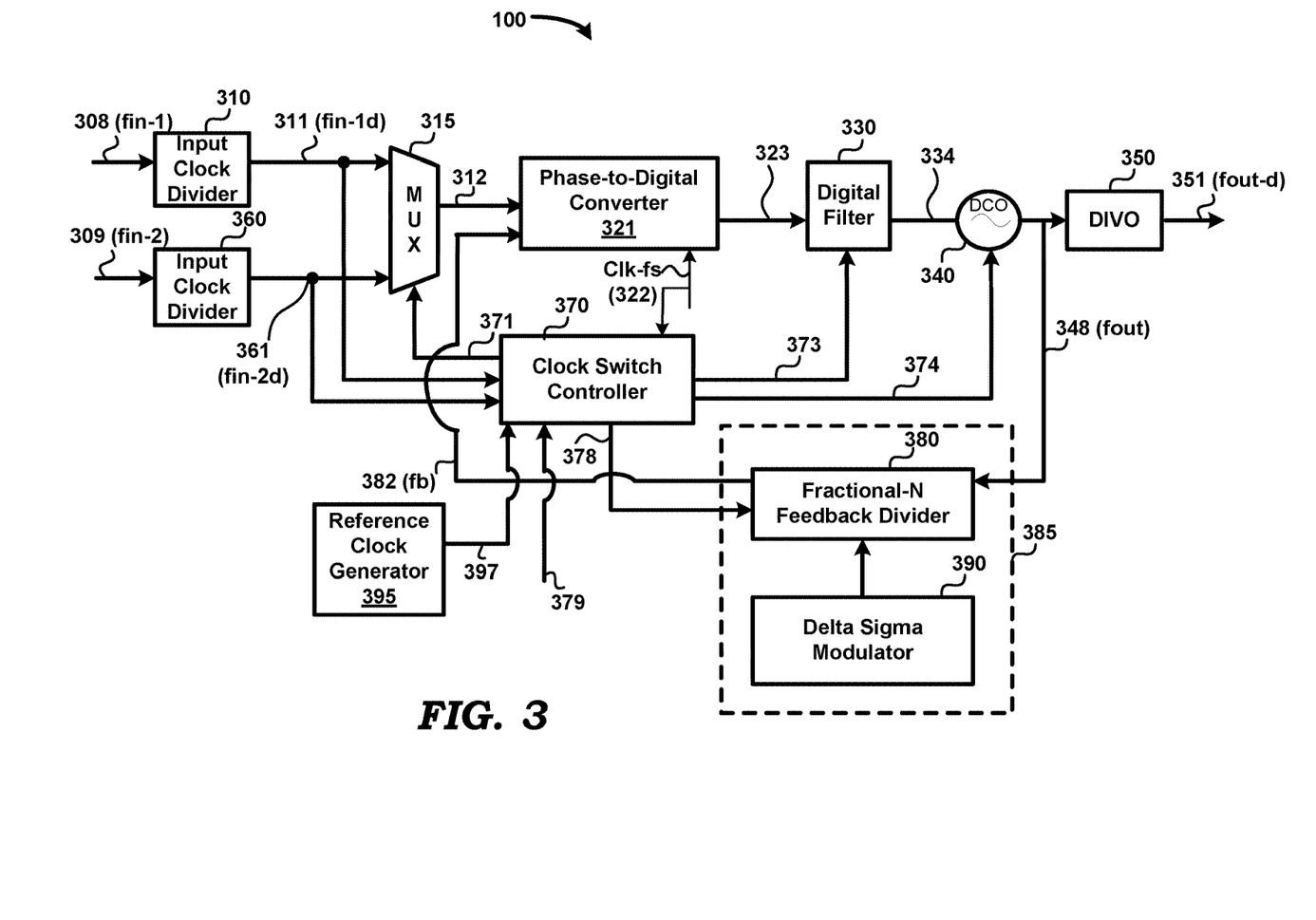
FIG. 3 is a block diagram of a phase locked loop (PLL) implemented according to aspects of the present disclosure, in an embodiment.

FIG. 3 is a block diagram of a PLL implemented according to aspects of the present disclosure, in an embodiment. PLL 100 is shown containing input clock dividers 310 and 360, multiplexer (MUX) 315, phase-to-digital converter 321, digital filter block 330, digitally controlled oscillator (DCO) 340, output clock divider (DIVO) 350, feedback clock divider 385, clock switch controller 370 and reference clock generator 395. The specific blocks/components of PLL 100 of FIG. 3 are shown merely by way of illustration. Other embodiments of PLL 100 can be implemented with other blocks/components, as would be apparent to one skilled in the relevant arts upon reading the disclosure herein. For example, phase-to-digital converter 321 can be replaced by a time-to-digital converter (TDC), with corresponding changes in PLL 100. Further, while feedback divider 385 is shown as a combination of a fractional (frac-N) feedback divider 385 and a delta sigma modulator (DSM) 390, feedback divider 385 can also be implemented as an integer divider if fractional division is not needed. Further, although PLL 100 is shown as receiving only two input clocks, more than two input clocks can also be provided as input clocks to PLL 100, with corresponding changes and additions to PLL 100 which would be apparent to one skilled in the relevant arts. Further yet, while blocks 321, 330 and 340 are described as being implemented as digital blocks (block 321 may contain a mix of digital and analog sub-blocks), in another embodiment these blocks are implemented as traditional analog blocks, such as for example, analog phase detector plus charge pump, analog loop filter and voltage controlled oscillator (VCO). When implemented as an analog filter, the delay block (described below) can be implemented as an analog delay line (e.g., co-axial cable, inductor-capacitor ladder delay block, etc.)

Input clock divider 310 receives input clock fin-1 on path 308, divides fin-1 to generate a desired frequency, and provides the frequency-divided input clock as an output on path 311 (fin-1*d*). Input clock divider 360 receives input clock fin-2 on path 309, divides fin-2 to generate a desired frequency, and provides the frequency-divided input clock as an output on path 361 (fin-2*d*). The divide ratios used by dividers 310 and 360 have values such that the clocks fin-1*d* and fin-2*d* have the same frequency (possibly within some error margin).

MUX 315 receives fin-1*d* and fin-2*d*, and forwards one of fin-1*d* and fin-2*d* on path 312 as an output (MUX output/selected clock) based on the logic value of select signal 371.

Phase-to-digital converter 321 receives MUX output 312 and a feedback clock 382 (fb), generates an (internal) error signal whose value is proportional to the (present) phase difference between signals 312 and 382, and provides the error signal in digital form on path 323. Path 323 may represent one or multiple digital paths, each path for a corresponding bit of the digitized error signal. Phase-to-digital converter 321 receives a sampling clock Clk-fs (322), and generates the digital error signals on path 323 at the rate fs. Clk-fs (322) may be generated internally in PLL 100.

In alternative embodiments, component/block 321 can be implemented as a time-to-digital converter (TDC) in a known way, with corresponding modifications to the implementation of other blocks of PLL 100 as would be apparent to one skilled in the relevant arts. In general, component 321 operates as a phase detector, receives signals 312 and 382 (fb) and generates a digitized error signal on path 323, the digitized error signal representing the phase error between the signals 312 and 382 (fb).

Digital filter block 330 employs one or more digital low-pass filters and a delay block. The digital low-pass filter(s) receive the digital values on path 323, and apply low-pass filtering to the stream of digital values. The delay block adds a delay to the filtered stream of digital values. Alternatively, the delay can be provided prior to the low-pass filtering also. The delayed and low-pass-filtered digital stream is provided as an input DCO 340, and determines the frequency of the clock waveform provided as an output clock on path 348 (fout).

According to an aspect of the present disclosure, the delay provided by digital filter block 330 enables PLL 100 to switch between input clocks without incurring transients in output clock fout (348) due to the non-zero time that may be required by clock switch controller 370 (described below) to switch PLL 100 to using a different input clock than the currently used input clock. The implementation details of digital filter block 330 in an embodiment of the present disclosure are provided below with reference to FIG. 4. DIVO 350 divides the frequency of fout by a desired ratio, and thus generates fout-d (351).

Feedback divider 385 receives fout (348), and operates to divide the frequency of fout to a desired value. Generally, the divide ratio provided by feedback divider 385 enables fout to be generated at a multiple of the frequency of the selected one of input clocks fin-1 and fin-2. DSM 390 may be programmed by a user (via means not shown) to cause feedback divider 385 to use a fractional divide ratio. Depending on the specific divide ratio, DSM 390 generates a corresponding set of divide values (which are repeatedly provided to feedback divider 385) to cause the divided clock fb (382) to have a frequency which, on an average, equals the desired fraction of the frequency of fout. An integer-only divider can also be used in place of component 385. Alternatively, DSM 390 can be programmed to cause feedback divider 385 to divide fout by an integer divisor also. Feedback divider 385 may be viewed generating successive cycles of fb (382), each cycle being generated at the end of a pre-determined number of cycles of fout, the predetermined number of cycles of fout being determined by the divide ratio.

Clock switch controller 370 receives clocks fin-1d and fin-2d. Clock switch controller 370 includes circuitry for determining whether the clocks are valid/functional or failed. In addition clock switch controller receives sampling clock clk-fs (322) to enable operations (including counting). In an embodiment, such circuitry is implemented as one or more counters, which counts the number of cycles (in a predetermined time duration) of the received clocks to determine if the corresponding clock is functional. Clock switch controller 370 may require a non-zero length of time to determine if the currently used input clock is non-functional or not. In an embodiment of the present disclosure, clock switch controller 370 is designed to require a count of two cycles to declare whether the corresponding clock is functional or not.

Clock switch controller 370 may be pre-programmed to consider fin-1/fin-1d as the primary clock and fin-2/fin-2d as the secondary/redundant clock. Thus, by default (e.g., upon power-up of PLL 100), clock switch controller 370 may program the binary value of select signal 371 to cause MUX 315 to forward fin-1d on path 312. Clock switch controller 370 continues to check if fin-1d is functional. On determining that fin-1d has failed (is invalid/non-functional) or if an express command is received from an external device on path 379 (for example based on user input or from an external device) to switch to the secondary clock, clock switch controller 370 operates to achieve a hitless switchover to fin-2d by controlling components in digital filter block 330 and feedback divider 385, as described below. Clock switch controller 370 may require a non-zero length of time to react to the express command received on path 379, and thus switch to the secondary clock. Clock switch controller 370 may operate similarly to switch from using the secondary clock to using the primary clock if the secondary clock fails or if an express command is received on path 379 to switch back to the primary clock. Reference clock generator 395 generates a (high-precision and high-stability) reference clock 397, which is used as described below. In general, the ratio of the frequency of reference clock 397 to the (ideal/desired) frequency of fin-1d and fin-2d is fixed and known a priori (the ratio can be a fraction or an integer). Reference clock 397 is used for estimating the frequency error of (actual) frequency of fin-1d and/or fin-2d with respect to the ideal/desired frequency, and is used to correct for such error in the output of PLL 100, as described below. Clock switch controller 370 generates a reset signal RST-sync (378) to release feedback divider 385 from reset synchronously with respect to clock fin-2d (361) as described in sections below. Clock switch controller 370 may be implemented in a known way.

The implementation details of digital filter block 330 in an embodiment of the present disclosure are provided next.

4. Digital Loop Filter

Figure 4:
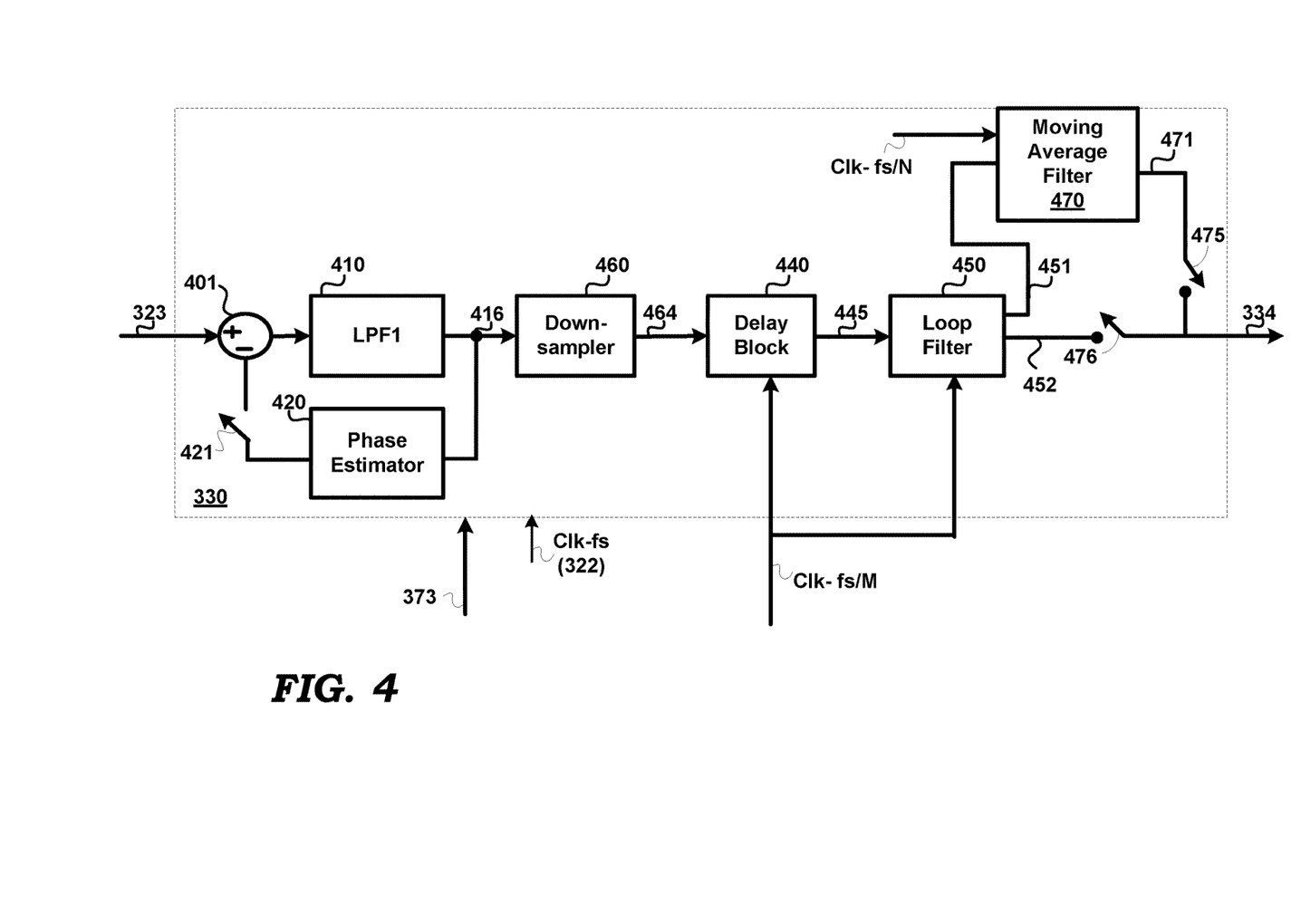
FIG. 4 is a block diagram of a digital loop filter used in a PLL, in an embodiment of the present disclosure.

FIG. 4 is a block diagram illustrating the implementation details of a digital loop filter in an embodiment of the present disclosure. Digital filter block 330 is shown containing summing block 401, low-pass filter 410 (LPF1), down-sampler 460, Delay block 440, loop filter 450, phase estimator 420, switch 421, switch 475, switch 476 and moving average filter 470. The specific blocks and interconnections of FIG. 4 are shown merely by way of example. More or fewer blocks can be used in other embodiments of the present disclosure. For example, in an alternative embodiment, down-sampler 460 and Loop Filter 450 are not implemented. In such an alternative embodiment, the output of LPF1 is connected to delay block 440, and the output of delay block 440 is provided on path 334. Further, the specific location of delay-block 440 in the above-noted embodiments can also be before any low-pass filtering. For example, delay block 440 can be connected to receive the digital samples on path 323, and the output of delay block 440 can be connected to summing block 401.

In yet another embodiment, phase estimator 420, summing block 401, down-sampler 460 and loop filter 450 are not implemented. In such an embodiment, LPF1 is directly connected to receive the samples on path 323, with the output of LPF1 being connected to delay block 440. The output of delay block 440 is directly connected to path 334. In an alternative embodiment, in which also phase estimator 420, summing block 401, down-sampler 460 and loop filter 450 are not implemented, delay block 440 is directly connected to receive the samples on path 323. In the embodiment, the output of delay block 440 is connected to LPF1, which in turn provides filtered samples on path 334. Thus, in general, digital filter block 330 can either first delay the sequence of digital samples (numbers) received on path 323 and then perform low-pass filtering on the sequence of delayed samples, or first perform low-pass filtering of the sequence of digital samples and then delay the filtered sequence of samples. Furthermore, delay block 440 can be placed at the output of MUX 316, and prior in sequence to phase-to-digital converter 321 (or in general to a phase detector), although such an implementation may be less efficient in terms of power and area to implement the delay, and which may also introduce phase noise (jitter) in the output clock.

The operation of some of the blocks of FIG. 4 may be performed at a rate (fs) equal to that of clk-fs provided to phase-to-digital converter 321 of FIG. 3, and one or more clocks derived from clk-fs, as noted below. Clock switch controller 370 controls the corresponding blocks of digital filter block 330 via control path 373. The internal paths from 373 to the corresponding block(s) are not shown in FIG. 4, as there may be multiple ways of implementing such control, which would be apparent to one skilled in the relevant arts upon reading the disclosure herein.

In an embodiment, each of blocks 401, 410, 420 and 460 receives a clock Clk-fs (which may be generated internally in PLL 100), and operates at a rate of fs. Thus, samples on path 323 are received at a rate of one sample every 1/fs seconds, LPF1 provides samples of a filtered sequence on path 416 at a rate of one sample every 1/fs seconds, etc. Each of blocks 440 and 450 receives a clock Clk-fs/M, and operates at a rate of fs/M. Thus, samples on path 464 are received at a rate of one sample every M/fs seconds, delay block 440 provides samples of a delayed sequence at a rate of one sample every M/fs seconds, Loop Filter 450 provides samples of a filtered sequence on path 334 at a rate of one sample every M/fs seconds, etc.

Referring now to FIG. 4, summing block 401 receives a sequence of samples on path 323 at a rate which may equal 1/fs seconds per sample. When switch 421 is open, summing block 401 forwards the sequence of received samples to LPF1. The operation of summing block 401 when switch 421 is closed is described in sections below.

LPF1 may operate at the rate fs, and receives the sequence of samples from summing block 401. LPF1 performs low-pass filtering of the sequence and forwards a filtered sequence on path 416 to down-sampler 460. Low-pass filtering refers to a filtering operation by which frequency components in a signal (here, the filtered sequence) with a frequency lower than a selected cutoff frequency are passed, while those with frequencies higher than the cutoff are attenuated or "cut-off".

Down-sampler 460 operates to reduce (down-sample) the sample rate fs to (fs/M), and thus reduces the number of samples in a received sequence of samples on path 416. 'M' may be an integer, or a fraction, either being greater than one. The down-sampling by down-sampler 460 may be achieved, for example, by employing averaging of samples or dropping same samples in the received sequence to obtain a down-sampled sequence of samples. Down-sampler 460 is generally used to reduce processing complexity and power consumption. Down-sampler 460 forwards the down-sampled sequence of samples to delay block 440.

Delay block 440 operates to provide a pre-determined delay to each sample received on path 464, and provides corresponding delayed samples on path 445. The details of delay block 440 in an embodiment of the present invention are provided in sections below. The implementation of delay block 440 subsequent to down-sampling as in FIG. 4 may enable lower implementation area for and lower power consumption in delay block 440 (as well as less clock jitter in fout) than if delay block 440 were to be implemented to directly delay the selected clock on path 312 or prior to MUX 315.

Loop filter 450 may operate at the rate fs/M, and receives the down-sampled sequence of samples from delay block 440. Loop filter 450 performs further low-pass filtering of the down-sampled sequence and generates a filtered sequence (first final error signal) on output 452. During normal operation, clock switch controller 370 maintains switch 476 closed and switch 475 open, and output 452 is provided on path 334. The filtered samples on path 334 determine the frequency of the clock 348 (fout) generated by DCO 340. A more tightly filtered sequence (i.e., a sequence filtered such that the filter response has a sharper roll-off than for the sequence on path 452) is provided by loop filter 450 on path 451 (second final error signal) to moving average filter 470 as another output. In an embodiment, loop filter 450 is a proportional-integral (PI) controller. Output 452 is the sum of proportional and integral path components, while output 451 has only the integral path component and thus has one extra first order roll-off attenuation compared to 452.

Moving average filter 470 operates at the rate fs/N (N being an integer) to compute a 'moving average' of the values of a pre-determined number of samples (size of subset) on path 451. 'N' may be an integer that is different from 'M' (as in fs/M), and thus rate fs/N may be different from rate fs/M. As is well-known in the relevant arts, a 'moving average' refers to a series of averages of different subsets of the full data set (here the samples on path 451). Thus, for example, assuming that moving average filter 470 operates at the rate fs, and also assuming that feedback divider 380 is not reset prior to t534, moving average filter 470 may compute the average of samples in interval t51-t53, and provide the computed average as output 471 at t53. Moving average filter 470 may compute the average of samples in interval t52-t534, and provide the computed average as output 471 at t534, and so on.

Switch 475 is open when PLL 100 is locked in frequency and phase to any of fin-1$d$ and fin-2$d$ (input clock in general). The specific duration and the number of samples used to compute the moving average is provided merely by way of illustration. More or fewer samples, and/or weighted samples, can also be used for such computation.

Figure 5A:
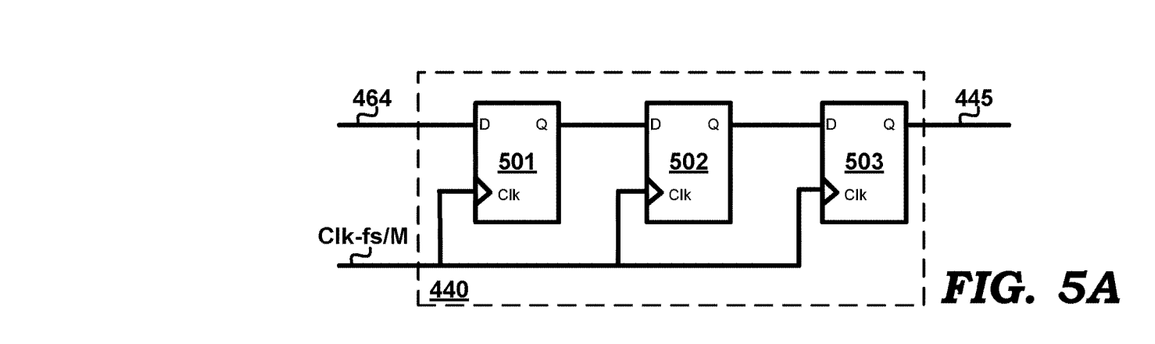
FIG. 5A is a block diagram of a delay block used in a PLL, in an embodiment of the present disclosure.

The implementation details and operation of delay block 440 in an embodiment of the present disclosure are shown in FIG. 5A. Delay block 440 is shown in FIG. 5A as implemented using three flip-flops (FF) 501, 502 and 503. The output (Q) of each flip-flop is delayed by a duration M/fs with respect to its input (D). Each of the three flip-flops is clocked by clock Clk-fs/M. As a result, the samples on path 334 are delayed (later in time) with respect to the corresponding samples on path 323 by a delay equal to (3M/fs). Other magnitudes of delay can also be used instead of 3M/fs by employing a different number of flip-flops. Due to the operation of delay block 440, PLL 100 (during normal operation) in effect, locks to, and tracks, a delayed version of the currently selected clock.

The manner in which hitless switching is according to various aspects of the present disclosure is described next.

5. Hitless Switching

Figure 5B:
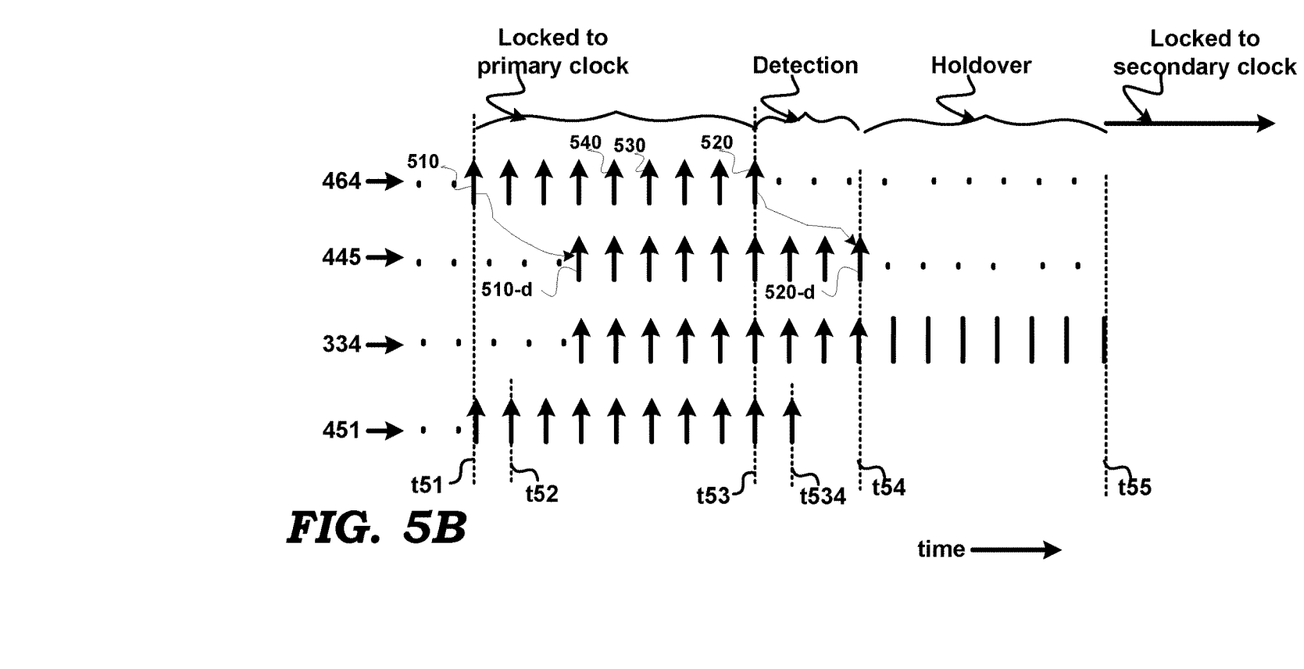
FIG. 5B is a timing diagram illustrating the manner in which transients in an output clock are minimized, in an embodiment of the present disclosure.

FIG. 5B is a diagram illustrating the manner in which transients in fout are minimized, in an embodiment of the present disclosure. In particular, the diagram illustrates the manner in which transients in fout 348 (and therefore in fout-d 351) are prevented or minimized upon failure of a currently used input clock (one of fin-1 and fin-2), or upon responding to an express command received on path 379 to switch from using one of the input clocks to the other. A portion of each of the sequence of digital samples at the input 464 of delay block 440, output 445 of delay block 440 and on path 334 is shown in FIG. 5B. Each sample is shown represented by an arrow. In the interest of simplicity, all arrows are shown as having equal height. However, in general, the digital values that the arrows represent can have different magnitudes depending on whether PLL 100 is in a locked state with respect to the currently-used input clock or not. Further, even in a locked state, there may be slight variations in the magnitudes of the samples due to noise effects.

The samples on each of paths 464, 445 and 334 are generated (or forwarded) at the rate of fs/M. Assuming a delay of (3M/fs) due to delay block 440, sample 510 on path 464 is delayed by a time duration equal to (3M/fs), and is provided as delayed sample 510-d on path 445. Similarly, sample 520 on path 464 is delayed by a time duration equal to (3M/fs), and is provided as delayed sample 520-d on path 445. Each of the other samples shown generated on path 464 is similarly delayed, and provided on path 445. Each digital value on path 334 shown in FIG. 5B is a sample of a filtered sequence of digital values generated by loop filter 450, and causes DCO 340 to generate output clock fout (348) at a corresponding frequency.

In the interval from time instant t51 to time instant t53, PLL 100 is assumed to be in phase as well as frequency lock with fin-1d. Again, for conciseness only a few samples are shown in FIG. 5B for such locked condition. Typically, the duration can be longer (including the interval up to t51 from an earlier time instant), and include more samples than shown.

Input clock fin-1 is assumed to fail at t53. Alternatively, an express command on path 379 from an external device) to switch to fin-2 may be received at t53. Clock switch controller 370 determines within a duration of 3M/fs from t53 (i.e., at t54) that input clock fin-1 has failed, wherein it is assumed that clock switch controller 370 is designed to use three cycles of Clk-fs/M as the threshold to determine that an input clock is functional or not. Clock switch controller 370 may contain a pair of clock monitoring circuits using counters working off a high frequency reference clock (for example, fs, in some embodiments) internally (not shown), that may respectively receive fin1-d and fin2-d as trigger signals and generate corresponding count values at the end of every cycle of fin-1d/fin2-d clock. Clock switch controller 370 uses the count values to detect the failure of the input clock. The clock monitor circuits may be designed to utilize 2 cycles of Clk-fs/M as a threshold duration to ascertain whether the input clock is functional. Upon failure of the input clock, signal 464 becomes invalid. Other techniques for determining failure of the input clock can also be used in the alternative.

Other thresholds (e.g., other than two cycles of Clk-fs/M) can be used in the alternative to determine failure of input clock. If an express command is received to switch to the other input clock, clock switch controller 370 may take a non-zero duration of time starting from t53, and less than interval t53-t54, to respond to such command. However, in the example of FIG. 5B, since the samples on path 445 represent those on path 464 delayed by 3M/fs, clock switch controller 370 has a maximum duration of 3M/fs seconds in which to react to the loss of the input clock or receipt of the express command, without causing any transients (or with only minimal transient) to occur in fout or fout-d.

Sometime within interval t54-t55, but prior to t55 of FIG. 5B, clock switch controller 370 generates select signal 371 to cause MUX 315 to forward fin-2d on path 312. In an embodiment, clock switch controller 370 generates select signal 371 to cause MUX 315 to forward fin-2d on path 312 upon determination that fin-1 has failed (t54 in this example), or that fin-2 should be used to generate fout (348).

In duration t54-t55, clock switch controller 370 operates PLL 100 in 'holdover mode', corrects for effects (termed phase build-out error) due to any non-zero phase difference between fin-1 and fin-2 (or equivalently, between fin-1d and fin-2d), and switches to using fin-2 as the input clock for PLL 100, as described next.

6. Switching Input Clocks

Upon determining that the input clock used to generate fout needs to be switched, i.e., at or slightly later t54, clock switch controller 370 causes switch 476 to be open and switch 475 to be closed. In addition, clock switch controller 370 causes loop filter 450 not to forward a filtered output on path 451. As a result, starting at t54, the last/latest (here at t54) moving average value computed by moving average filter 470 is maintained by moving average filter 470 on path 334, and PLL 100 starts operating in open-loop mode, also termed 'holdover mode'. In the holdover mode, DCO 340 does not respond to the input clocks (i.e., does not respond to changes in signals fin-1d or fin-2d). In another embodiment, clock switch controller 370 causes an earlier (than the latest noted above) moving average value to be provided and maintained on path 334.

In FIG. 5B, PLL 100 is shown as operating in holdover mode for the interval t54-t55. The last moving average value is indicated as a vertical line, and the same value is provided every M/fs seconds on path 334 in the interval t54-t55. The specific duration of the holdover mode is shown merely by way of illustration in FIG. 5B. Shorter or longer durations for the holdover mode can also be used. The duration of the holdover mode is usually only as long as required for clock switch controller 370 to switch PLL 100 to using the other input clock (e.g., fin-2) with minimal or no transient on fout, as described below.

DCO 340 continues, until t55, to generate fout at the same frequency as that at t54, the frequency being determined by the output of moving average filter 470 as described above. Thus, due to the delay provided by delay block 440, and operation in holdover mode, output clock fout (as well as fout-d) continue to be generated without any phase transient occurring due to loss of fin-1.

Clock switch controller 370 causes PLL 100 to switch to using fin-2 as the input clock, and to generate fout derived from fin-2, as described next.

Figure 6:
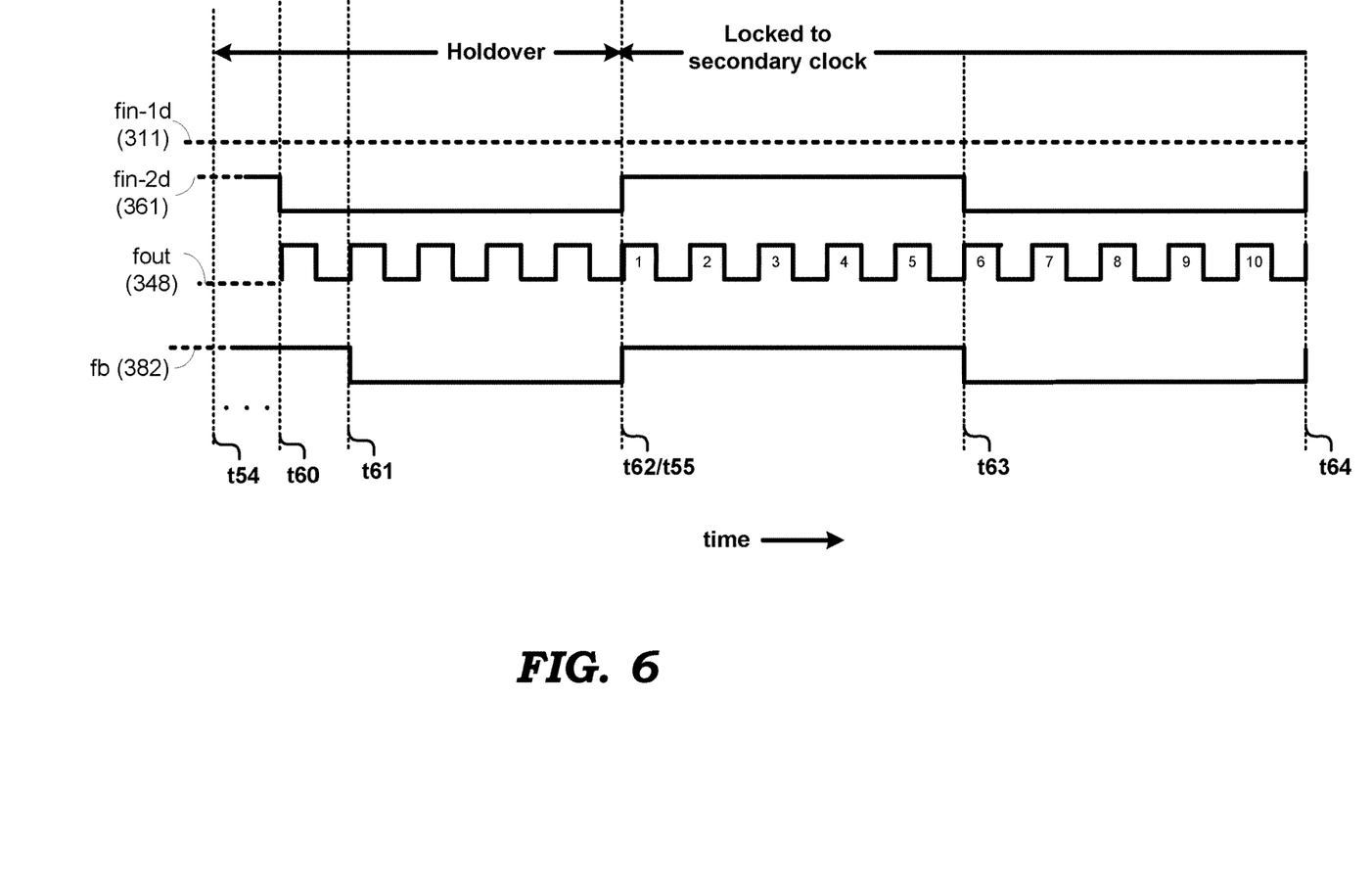
FIG. 6 is a timing diagram illustrating the manner in which a PLL switches to using a different input clock with minimal impact on the output clock in the form of transients, in an embodiment of the present disclosure.

FIG. 6 is a timing diagram illustrating the manner in which PLL 100 switches to using a different input clock with minimal or zero impact on fout in the form of transients. A portion of the waveforms of signals fin1-d, fin-2d, fout and fb are shown there. It is assumed merely for illustration that the frequency of fout is ten times that of either of input clocks fin-1d and fin-2d. Further, it is assumed merely for illustration that fin-1 and fin-2 (and therefore fin-1d and fin-2d) are 180 degrees out of phase.

Time instant t60 of FIG. 6 occurs sometime between t54 and t55 of FIG. 5B. Time instant t54 of FIG. 5B is also indicated in FIG. 6. Time instant t62 of FIG. 6 is the same as time instant t55 of FIG. 5B, and is therefore indicated in FIG. 6 as t62/t55. Fout (348) is maintained at the same frequency as at t54 (i.e., ten times that of fin-1d, as assumed) by the operation of moving average filter 470 as described above.

At t61, clock switch controller 370 resets feedback divider 385, and holds feedback divider 385 in reset until t62, at which point feedback divider 385 is restarted synchronous with fin-2d. However, it is to be understood that, clock switch controller 370 can reset feedback divider 385 at any time starting at t54 (of FIG. 5B) and prior to t62. In another embodiment, clock switch controller 370 resets feedback divider 385 at t54 (the start of the holdover duration). Clock fb (382) transitions to logic low at t61. Feedback divider 385 is held in reset until t62, as noted above. Thus, fin-1d is not valid or active in the portion shown in FIG. 6 as indicated by the dotted line.

At t62, synchronous with the rising edge of fin-2d, clock switch controller 370 enables (re-starts) feedback divider 385, i.e., clock switch controller 370 releases the reset and causes feedback divider 385 to start dividing Fout again starting at t62. Hence, in FIG. 6, feedback divider 385 is shown as dividing fout by 10 (starting at t62) to generate fb. The ten cycles of fb between t62 and t64 are numbered 1 through 10 in FIG. 6. Also at t62, clock switch controller 370 opens switch 475, closes switch 476, and thus causes the output of loop filter 450 to be provided again on path 334. As a result, PLL 100 exits holdover state and starts operation in closed loop mode again starting at t62.

Thus, at t62, feedback divider 385 is viewed as restarting counting of a pre-determined number of cycles (as determined by the divide ratio) of fout synchronous with fin-2d, with feedback divider 385 thereafter counting the pre-determined number of cycles before generating each next cycle of said successive cycles. In alternative prior techniques, such synchronization may be obtained several clock cycles of Fout, with the phase/frequency of Fout also potentially deviating from the required steady state.

Figure 8A:
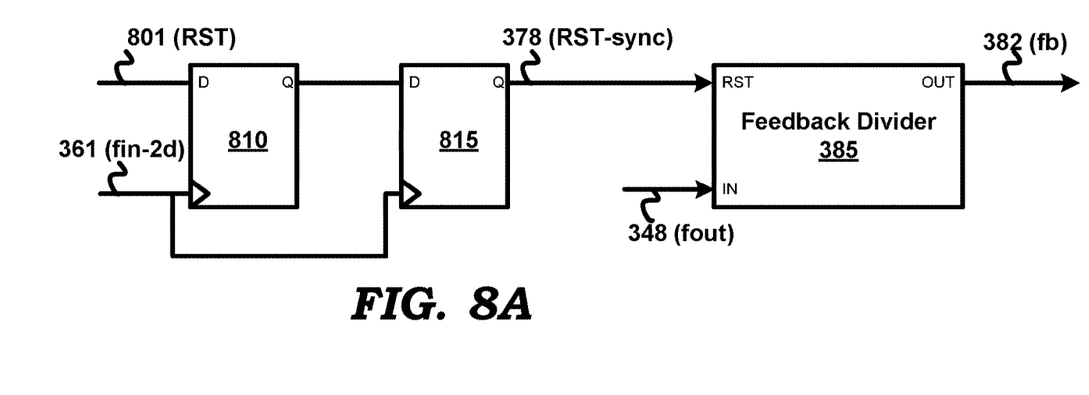
FIG. 8A is a block diagram illustrating the manner in which a feedback divider is released from reset synchronously, in an embodiment of the present disclosure.
Figure 8B:
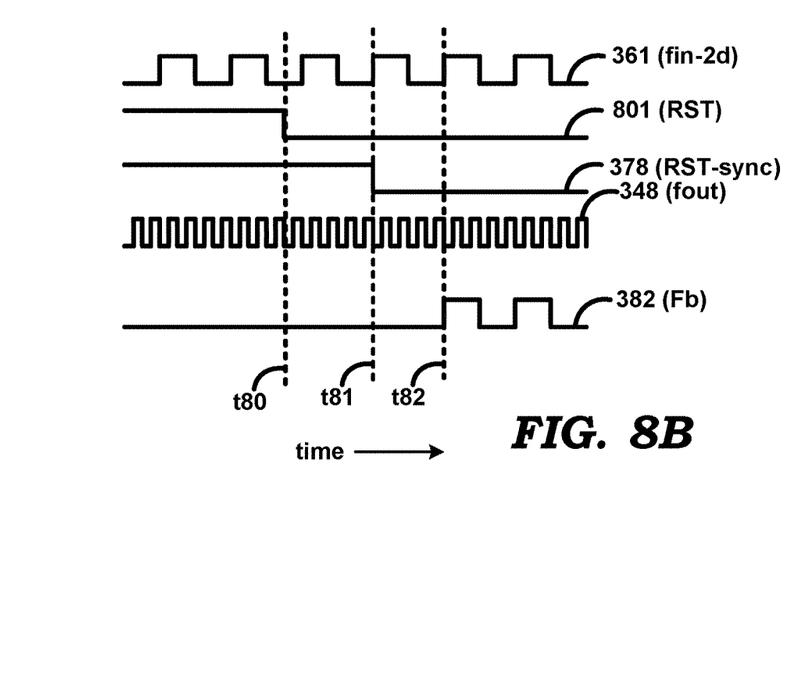
FIG. 8B is a timing diagram showing relevant waveforms that illustrate the synchronous release from reset of a feedback divider, in an embodiment of the present disclosure.

FIG. 8A is a block diagram illustrating the manner in which feedback divider 385 is released from reset synchronously with respect to fin-2d, in an embodiment of the present disclosure. The Figure is shown containing flip flops (FF) 810 and 815, and feedback divider 385 (of FIG. 3). Flip flops 810 and 815 are contained within clock switch controller 370 (of FIG. 3), and are each clocked by fin-2d (361). Signal 801 (RST) is generated within clock switch controller 370, and is provided to the D input of FF 810. The Q output of FF 810 is provided to the D input of FF 815. The Q output of FF 815 is the synchronized reset signal 378 (RST-sync), which is applied to the RST (reset) terminal of feedback divider 385. Signals fout and fb are also indicated in FIG. 8A. FIG. 8B is a timing diagram illustrating the synchronous resetting of feedback divider 385, and shows waveforms of signals fin-2d, RST, RST-sync, fout and Fb. Clock switch controller 370 activates RST (801) to active low condition (asynchronously) at time t80. Signal 378 (RST-sync) is set to logic low synchronously with respect to fin-2d at t81 thereby releasing feedback divider 385 from the reset state synchronously, and feedback divider 385 starts counting the edges of its input clock (fout in this case). One clock cycle of fin-2d later, i.e., at t82, feedback divider 385 generates the first rising edge. Time instant t82 of FIG. 8B corresponds to time instant t62/t55 of FIG. 6.

In yet another embodiment, clock switch controller 370 performs both the resetting of the feedback divider 385 first followed by restarting of, feedback divider 385 synchronously at t62 (FIG. 6).

It may be appreciated that that the operation of clock switch controller 370 as described above renders fb to be synchronous with fin-2d (now on path 312). In other words, the phase of fin-2d is the same as that of fb starting at t62, i.e., signals 312 and 382 (fb) are already synchronized in frequency and phase starting at t62. Therefore, starting from t62/t55, the output of digital filter block 330 is substantially the same as the output of moving average filter 470 in the holdover interval t54-t55. As a result, PLL 100 is in phase and frequency lock with fin-2d (and therefore fin-2) right from t62. It may be observed from the description above and the waveform of fout shown in FIG. 6, that fout suffers minimal or no phase transient effects due to the clock switching, unlike that illustrated above with respect to FIG. 2, and hitless switching is thus achieved. However, in practice some residual phase error may still be present, and the manner in which such residual phase error is corrected is described next.

7. Residual Phase Error Correction

In another embodiment of the present disclosure, clock switch controller 370 performs additional operations prior to restarting PLL 100 to operate in closed-loop mode at t62, i.e., prior to restarting feedback divider 385, opening switch 475 and causing the output of loop filter 450 to be provided again on path 334. The reason for such additional operation is that, although the phase error starting at t62 between fb and fin-2d is noted above as being zero, in practice, due to implementation effects and/or errors in feedback divider 385, a residual phase error of plus or minus (+/−) one period of fout may still persist between fb and fin-2d. One cause for such residual phase error may be due to timing uncertainty in synchronous release of feedback divider 385 from reset.

In such an embodiment, with PLL 100 still in open-loop/holdover mode, clock switch controller 370 is operative to cause digital filter block 330 to estimate the magnitude and sign of the residual phase error over an 'estimation window' contained within the 'holdover' duration and prior to the resetting of feedback divider 385, i.e., within interval t54-t61 of FIG. 6. Immediately prior to the start of the estimation window (not shown in the Figures), the output of phase estimator 420 is zero, and path 323 contains the residual error between fin-2d and fb 382. Feedback divider 385 is operational during the estimation window, and not held in reset, but is synchronously restarted with respect to fin-2d (as illustrated with respect to FIG. 6 above). At the start of the estimation window (with feedback divider 385 now operational), clock switch controller 370 maintains switch 421 open. The residual error on path 323 is accumulated in phase estimator during the estimation window.

At the end of the estimation window (which can occur at or prior to t62), clock switch controller 370 closes switch 421, and the estimated residual phase error from phase estimator 420 is available to summing block 401 as another input. When switch 421 is closed, the signal on path 416 may be viewed as a "corrected error signal". Thereafter, phase estimator 420 retains the estimated phase error at its output (without further responding to the values on path 416), with switch 421 remaining closed. At t62, clock switch controller 370 opens switch 475, causes the output of loop filter 450 to be provided again on path 334. Thus, PLL 100 starts operating in closed loop mode again at t62. Summing block 401 subtracts the phase error generated by phase-to-digital converter 321 on path 323 from the estimated residual phase error. Thus, at t62, the phase error values input to LPF1 are ideally zero (ignoring noise effects due to finite digital precision), and PLL 100 is locked to fin-2d. Due to such operation, phase transients on fout are further minimized or even completely avoided.

According to yet another aspect of the present disclosure, upon either failure of an input clock or upon receipt of an express command to switch input clocks, and after entering holdover mode, clock switch controller 370 (in addition to the operations described above) computes any frequency error between the two input clocks based on continuous frequency measurement/monitoring prior to clock loss. Clock switch controller 370 receives a reference clock 397 (generated by reference clock generator 395 of FIG. 3, and which is always ON and available), which is designed to have a frequency that is related to the ideal frequency desired for fin-1d and fin-2d as noted above. Reference clock 397 is a precision clock with a frequency that is a predetermined multiple or sub-multiple of the ideal desired frequency of fin-1d and fin-2d. The terms multiple and sub-multiple noted above include integers as well as fractions. Clock switch controller 370 contains precision frequency measurement blocks internally to continuously monitor for any frequency error in the two input clocks. Thus, clock switch controller 370 continuously compares the frequencies of each of the two input clocks against the frequency of the reference clock 397, and at all times has a measure of the frequency difference between the failed clock and the redundant clock. Prior to resuming operation of PLL 100 in closed loop mode starting at t62, clock switch controller 370 transmits the computed frequency error to DCO 340. DCO 340 is designed to reduce the frequency error from the new input clock (fin-2d in this example) in a controlled manner by gradually changing the frequency fout from the un-corrected to corrected value. Gradual change refers to a non-abrupt (or step) change, and DCO 340 may effect such change in a ramped (linear) or non-linear manner. Clock switch controller 370 then (at t62) opens switch 475, enables loop filter 450 to provide its output on path 334, synchronously restarts feedback divider 385 with respect to fin-2d, and PLL 100 starts operating in closed-loop mode to track fin-2d.

According to yet another aspect of the present disclosure, upon loss of all the clocks (both of fin-1 and fin-2, in the example of FIG. 3), PLL 100 is maintained in the holdover state as noted above. Upon any of the inputs clocks becoming valid again, clock switch controller 370 computes the difference in frequency error (with respect to reference clock 397) of the last valid input clock before entering into holdover state and the newly valid clock (with respect to reference clock 397). Prior to resuming operation of PLL 100 in closed loop mode starting at t62, clock switch controller 370 transmits the computed frequency error to DCO 340. DCO 340 is designed to reduce the frequency error from the newly valid clock in a controlled manner by ramping the frequency fout from the un-corrected to corrected value. Clock switch controller 370 then (at t62) opens switch 475, enables loop filter 450 to provide its output on path 334, synchronously restarts feedback divider 385 with respect to the newly valid clock, and PLL 100 starts operating in closed-loop mode to track the newly valid clock (one of fin-1d or fin-2d).

An example sequence of events (in time) for achieving hitless clock switching are summarized in general below:

1. When the primary clock is lost, after a finite interval of time (which is less than the delay implemented in the loop filter) clock switch controller 370 detects the clock loss.

2. Once this clock loss is detected, clock switch controller 370 may perform the following operations:
   a) Force PLL 100 to holdover mode.
   b) Place (and maintain) feedback divider 385 under reset.
   c) Clock switch controller 370 sets MUX 315 to choose the secondary clock.
   d) Release (and thus restart) feedback divider 370 from reset synchronously with respect to secondary clock (i.e., restart the feedback divider 370 at an edge of the secondary clock).
   e). Obtain a phase error between secondary clock and feedback clock over an estimation window.
   f). At the end of the estimation window, freeze the phase error and apply the phase error to the output of phase-to-digital converter to compensate for the phase error.
   g). Release PLL 100 from holdover, and allow PLL 100 to track the secondary clock.

Clock switch controller 370 may be implemented in a known way, as would be apparent to one skilled in the relevant arts upon reading the disclosure herein. In an embodiment, clock switch controller 370 is implemented to include one or more counters, and other digital blocks to together enable operations as described above.

PLL 100 implemented as described above can be used as part of a system as described next with an example.

8. System

Figure 7:
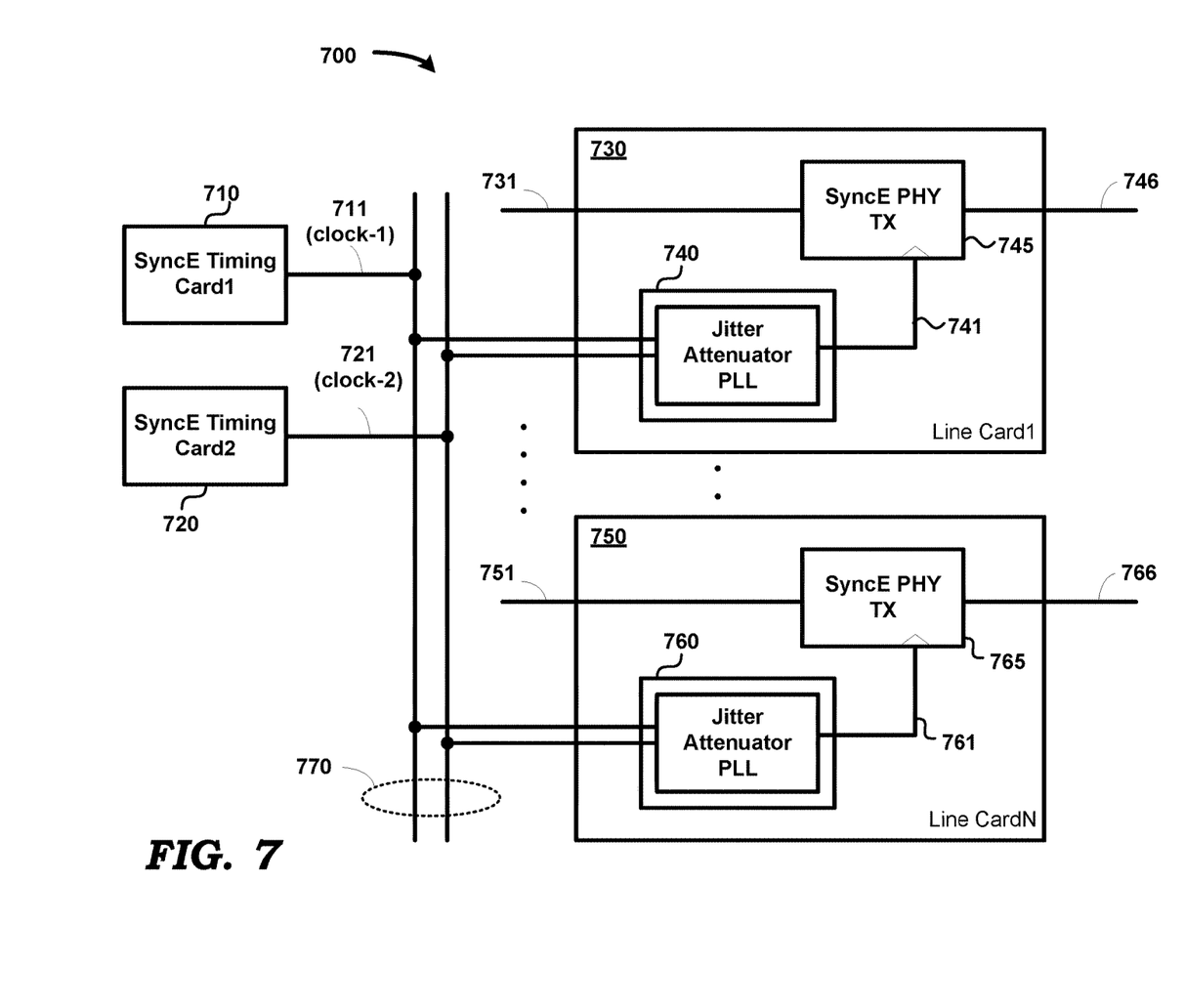
FIG. 7 is a block diagram of an example system containing a PLL implemented according to various aspects of the present disclosure.

FIG. 7 is a block diagram of an example system containing a PLL implemented according to various aspects of the present disclosure, as described in detail above. System 700 is shown containing SyncE (Synchronous Ethernet) timing cards (710 and 720) and line cards 1 through N, of which only two line cards 730 and 750 are shown for simplicity. Line card 730 is shown containing jitter attenuator PLL 740 and SyncE PHY Transmitter 745. Line card 750 is shown containing jitter attenuator PLL 760 and SyncE PHY Transmitter 765. The components of FIG. 7 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (For example from a timing card such as card 710 or 720). Accordingly, Ethernet packets are re-timed with respect to the master clock, and then transmitted in the physical layer. Thus, data packets (e.g., on path 731 and 732) are retimed and transmitted without any time stamp information being recorded in the data packet. The packets may be generated by corresponding applications such as IPTV (Internet Protocol Television), VoIP (Voice over Internet Protocol), etc.

Thus, line card 730 receives a packet on path 731, and forwards the packet on output 746 after the packet has been re-timed (synchronized) with a master clock. Similarly, line card 750 receives a packet on path 751, and forwards the packet on output 766 after the packet has been re-timed (synchronized) with a master clock.

The master clock (711/clock 1) is generated by timing card 710. Timing card 720 generates a redundant clock (721/clock-2) that is to be used by line cards 730 and 750 upon failure of master clock 711. Master clock 711 and redundant clock 721 are provided via a backplane (represented by numeral 770) to each of lines cards 730 and 750.

In line card 730, jitter attenuator PLL 740 may be implemented as PLL 100 described above in detail, and receives clocks 711 and 721. PLL 740 generates an output clock 741 which is used to synchronize (re-time) packets received on path 731 and forwarded as re-timed packets on path 746. Upon failure of master clock 711, PLL 740 is designed to provide hitless switching to clock 721 (to provide clock 721 on path 741) in the manner described above in detail.

Similarly, in line card 750, jitter attenuator PLL 760 may also be implemented as PLL 100 described above in detail, and receives clocks 711 and 721. PLL 760 generates an output clock 761 which is used to synchronize (re-time) packets received on path 751 and forwarded as re-timed packets on path 766. Upon failure of master clock 711, PLL 760 is designed to provide hitless switching to clock 721 (to provide clock 721 on path 761) in the manner described above in detail.

Although the switch to clock 721 is noted above as being performed in response to failure of master clock 711, such switching can also be triggered by an external device (not shown), the external device providing such trigger to each of PLLS 740 and 760.

9. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3, 4, 7 and 8A, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A phase locked loop (PLL) comprising:
a multiplexer (MUX) coupled to receive a first clock and a second clock, said MUX to forward said first clock as a selected clock if a select signal has a first value, said MUX to forward said second clock as said selected clock if said select signal has a second value;
a phase detector coupled to receive said selected clock and a feedback clock, said phase detector to generate an error signal representing a phase difference between said selected clock and said feedback clock;
a filter to generate a filtered error signal by filtering said error signal;
an oscillator coupled to receive said filtered error signal as an input, said oscillator to generate an output clock, wherein a frequency of said output clock is determined by a magnitude of said filtered error signal;
a feedback divider generating each of successive cycles of said feedback clock on counting of a pre-determined number of cycles of said output clock; and
a clock switch controller operable to:
detect at a first time instance, a condition requiring said MUX to change output to said second clock from said first clock;
upon detecting of said condition, change a value of said select signal from said first value to said second value starting from a second time instance following said first time instance; and
restarting, at a third time instance following said first time instance, said feedback divider to start counting said pre-determined number of cycles synchronous with said second clock to cause said feedback divider to thereafter count said pre-determined number of cycles before generating each next cycle of said successive cycles.

2. The PLL of claim 1, wherein, upon detecting said condition, said clock switch controller is further operable to maintain said oscillator in a holdover state to cause said oscillator to generate said output clock with a predetermined fixed frequency, wherein said output clock is non-responsive to either of said first clock or said second clock in said holdover state.

3. The PLL of claim 2, wherein said clock switch controller is further operable to terminate said holdover state following said third time instance, and thereby causing said PLL to track said second clock thereafter.

4. The PLL of claim 2, wherein said predetermined fixed frequency is a latest moving-average value of frequency values of said output clock in an interval immediately preceding occurrence of said condition.

5. The PLL of claim 2, further comprising a delay block in a path between said MUX and said oscillator, said delay block to delay a corresponding signal in said path so as to cause said PLL to lock to, and track, a delayed version of said selected clock,
wherein said clock switch controller processes said first clock to detect said condition.

6. The PLL of claim 5, wherein said corresponding signal is a down-sampled signal obtained by down-sampling said filtered error signal, wherein said path is between said phase detector and said oscillator.

7. The PLL of claim 5, wherein said clock switch controller is further operable to:
correct said error signal in an estimation window during said holdover state by causing a residual phase error to be subtracted from said error signal to generate a corrected error signal, wherein said oscillator generates said output clock based on said corrected error signal starting from the end of said holdover state.

8. The PLL of claim 7, wherein said phase detector is implemented as one of a phase-to-digital converter (PDC) and a time-to-digital converter (TDC) to generate said error signal in the form of corresponding digital samples, wherein said oscillator is a digitally controlled oscillator (DCO), wherein said filter is implemented as a digital filter block comprising:
a summing block coupled to receive said error signal, and a residual phase error signal representing said residual phase error on a first node, said summing block to subtract said residual phase error from said error signal to generate said corrected error signal;

a digital low-pass filter to perform low-pass filtering of said corrected error signal and to generate a first filtered error signal;

a phase estimation block coupled to receive said first filtered error signal and to generate said residual phase error signal at a second node;

a first switch coupled between said second node and said first node;

a down-sampler coupled to receive said first filtered error signal and to down-sample said first filtered error signal to generate a down-sampled error signal;

said delay block to delay samples of said down-sampled error signal to generate a delayed down-sampled error signal;

a second filter to perform low-pass filtering of said delayed down-sampled error signal to generate a first final error signal on a first output terminal, and a second final error signal on a second output terminal, wherein said first final error signal is said filtered error signal;

a moving average filter to generate a moving-average value of a predetermined number of samples of said second final error signal, wherein an input of said moving average filter is coupled to said second output terminal of said second filter; and a second switch coupled between an output of said moving average filter and an input of said oscillator; and a third switch coupled between said first output terminal of said second filter and said input of said oscillator, wherein, at the start of said holdover state, said clock switch controller closes said second switch, and opens said third switch, to cause a corresponding one of said moving-average values, instead of said filtered error signal, to be maintained as said input of said DCO for the duration of said holdover state, wherein said clock switch controller maintains said second switch in an open state and said third switch in a closed state during operation of said PLL outside of said holdover state, wherein said clock switch controller maintains said first switch in an open state outside of said estimation window.

9. The PLL of claim 8, wherein said clock switch controller is further operable to:

after restarting said feedback divider, but prior to ending said holdover state, close said first switch to cause said phase estimation block to provide said residual phase error signal to said summing block.

10. The PLL of claim 5, further comprising a reference clock generator to generate a reference clock with a reference frequency equal to a multiple or sub-multiple of the ideal frequency value of said selected clock, wherein said clock switch controller is coupled to receive said reference clock, and is further operable to:

during said holdover state, determine a frequency error between said ideal frequency value and the frequency of said selected clock; and transmit said frequency error to said oscillator, wherein said oscillator is designed to reduce said frequency error to zero in a non-abrupt manner prior to said clock switch controller ending said holdover state.

11. The PLL of claim 10, wherein upon failure of both of said first clock and said second clock, said clock switch controller is operable to:

maintain said oscillator in said holdover state to cause said oscillator to generate said output clock with a predetermined fixed frequency;

upon determining that at least one of said first clock and said second clock is again functional, compute a frequency error between said ideal frequency value and the frequency of the currently functional one of said first clock and said second clock; and transmit said frequency error to said oscillator, said oscillator being designed to reduce said frequency error to zero in a non-abrupt manner prior to said clock switch controller ending said holdover state.

12. The PLL of claim 1, wherein said condition is a failure of said first clock.

13. The PLL of claim 1, wherein said condition is an express request from an external device.

14. A system comprising:

a line card coupled to receive a data packet, said line card to re-time said data packet with reference to a selected clock, and to transmit a re-timed packet;

a first timing card to generate a first clock; and a second timing card to generate a second clock;

wherein said line card comprises a phase-locked loop (PLL) coupled to receive each of said first clock and said second clock, said PLL to provide said selected clock based on one of said first clock and said second clock, wherein said PLL comprises:

a multiplexer (MUX) coupled to receive said first clock and said second clock, said MUX to forward said first clock as a selected clock if a select signal has a first value, said MUX to forward said second clock as said selected clock if said select signal has a second value;

a phase detector coupled to receive said selected clock and a feedback clock, said phase detector to generate an error signal representing a phase difference between said selected clock and said feedback clock;

a filter to generate a filtered error signal by filtering said error signal;

an oscillator coupled to receive said filtered error signal as an input, said oscillator to generate an output clock, wherein a frequency of said output clock is determined by a magnitude of said filtered error signal;

a feedback divider generating each of successive cycles of said feedback clock on counting of a pre-determined number of cycles of said output clock; and a clock switch controller operable to:

detect at a first time instance, a condition requiring said MUX to change output to said second clock from said first clock;

upon detecting of said condition, change a value of said select signal from said first value to said second value starting from a second time instance following said first time instance; and restarting, at a third time instance following said first time instance, said feedback divider to start counting said pre-determined number of cycles synchronous with said second clock to cause said feedback divider to thereafter count said pre-determined number of cycles before generating each next cycle of said successive cycles.

15. The system of claim 14, wherein, upon detecting said condition, said clock switch controller is further operable to maintain said oscillator in a holdover state to cause said oscillator to generate said output clock with a predetermined fixed frequency, wherein said output clock is non-responsive to either of said first clock or said second clock in said holdover state.

16. The system of claim 15, wherein said clock switch controller is further operable to terminate said holdover state following said third time instance, and thereby causing said PLL to track said second clock thereafter.

17. The system of claim 15, wherein said predetermined fixed frequency is a latest moving-average value of frequency values of said output clock in an interval immediately preceding occurrence of said condition.

18. The system of claim 15, further comprising a delay block in a path between said MUX and said oscillator, said delay block to delay a corresponding signal in said path so as to cause said PLL to lock to, and track, a delayed version of said selected clock, wherein said clock switch controller processes said first clock to detect said condition.

19. The system of claim 18, wherein said corresponding signal is a down-sampled signal obtained by down-sampling said filtered error signal, wherein said path is between said phase detector and said oscillator, wherein said clock switch controller is further operable to:
correct said error signal in an estimation window during said holdover state by causing a residual phase error to be subtracted from said error signal to generate a corrected error signal, wherein said oscillator generates said output clock based on said corrected error signal starting from the end of said holdover state.

20. The system of claim 14, wherein said condition is one of a failure of said first clock and an express request from another device in said system.

* * * * *